(12) United States Patent
Hirano et al.

(10) Patent No.: US 12,424,503 B2
(45) Date of Patent: Sep. 23, 2025

(54) SEMICONDUCTOR DEVICE

(71) Applicant: DENSO CORPORATION, Kariya (JP)

(72) Inventors: Takahiro Hirano, Kariya (JP); Shun Sugiura, Kariya (JP); Masanori Ooshima, Kariya (JP)

(73) Assignee: DENSO CORPORATION, Kariya (JP)

( * ) Notice: Subject to any disclaimer, the term of this patent is extended or adjusted under 35 U.S.C. 154(b) by 651 days.

(21) Appl. No.: 17/697,195

(22) Filed: Mar. 17, 2022

(65) Prior Publication Data

US 2022/0208634 A1 Jun. 30, 2022

Related U.S. Application Data

(63) Continuation of application No. PCT/JP2019/039703, filed on Oct. 8, 2019.

(51) Int. Cl.
*H01L 23/31* (2006.01)
*H01L 23/48* (2006.01)

(52) U.S. Cl.
CPC .......... *H01L 23/3142* (2013.01); *H01L 23/48* (2013.01)

(58) Field of Classification Search
CPC ......... H01L 23/3107–315; H01L 23/48–4827; H01L 23/498–49861; H01L 2924/181; H01L 21/565–566; H01L 21/4885–4896; H01L 23/528; H01L 23/5283; H01L 23/5386; H01L 23/495–49579; H01L 2224/0601; H01L 2224/0603
See application file for complete search history.

(56) References Cited

U.S. PATENT DOCUMENTS

| | | | |
|---|---|---|---|
| 10,347,554 B2 * | 7/2019 | Santos | H01L 33/60 |
| 2011/0079887 A1 * | 4/2011 | Shim | H01L 23/49582 |
| | | | 257/676 |
| 2019/0157196 A1 * | 5/2019 | Sonehara | H01L 23/4952 |
| 2019/0221490 A1 | 7/2019 | Fujita | |

FOREIGN PATENT DOCUMENTS

| | | | | |
|---|---|---|---|---|
| JP | H11-260994 A | | 9/1999 | |
| JP | 2004-339584 A | | 12/2004 | |
| JP | 2007266047 A | * | 10/2007 | |
| JP | 2010283252 A | * | 12/2010 | H01L 24/48 |
| KR | 20160065763 A | * | 6/2016 | |

* cited by examiner

*Primary Examiner* — Julio J Maldonado
*Assistant Examiner* — Eric Manuel Mulero Flores
(74) *Attorney, Agent, or Firm* — Posz Law Group, PLC (57) ABSTRACT

A semiconductor device includes a semiconductor element, a sealing body, and a plurality of terminals. The sealing body seals the semiconductor element therein. The terminals are electrically connected to the semiconductor element inside of the sealing body, and project from the sealing body. Each of the terminals has a rough surface area having a larger surface roughness than a peripheral area in a section in a longitudinal direction of the terminal.

14 Claims, 6 Drawing Sheets

SEMICONDUCTOR DEVICE

CROSS REFERENCE TO RELATED APPLICATION

The present application is a continuation application of International Patent Application No. PCT/JP2019/039703 filed on Oct. 8, 2019, which designated the U.S. The entire disclosures of all of the above application are incorporated herein by reference.

TECHNICAL FIELD

The present disclosure relates to a semiconductor device.

BACKGROUND

For example, there is a semiconductor device including a semiconductor element, a sealing body that seals the semiconductor element therein, and a plurality of terminals that are electrically connected to the semiconductor element inside the sealing body and project outside from the sealing body. In general, the plurality of terminals are connected to, for example, an external connector provided on a circuit board.

SUMMARY

The present disclosure describes a semiconductor device. According to an aspect of the present disclosure, a semiconductor device includes a semiconductor element, a sealing body that seals the semiconductor element therein, and a plurality of terminals that are electrically connected to the semiconductor element inside the sealing body and project outside from the sealing body. Each of the plurality of terminals has a rough surface area in a section in a longitudinal direction of the terminal. The rough surface area has a larger surface roughness than a peripheral area.

BRIEF DESCRIPTION OF DRAWINGS

Features and advantages of the present disclosure will become more apparent from the following detailed description made with reference to the accompanying drawings, in which.

DETAILED DESCRIPTION

To begin with, a relevant technology will be described only for understanding the embodiments of the present disclosure.

In a semiconductor device having a plurality of terminals projecting from a sealing body, there is a case in which the terminals are bent in advance before being connected to a connector on a circuit board, depending on the position and orientation of the connector. At this time, even if a bending process is applied uniformly to the terminals using a tool or the like, spring back may unevenly occur in the terminals, so that the positions of the tip ends of the terminals are likely to be deviated. If the positions of the tip ends of the terminals are not aligned, it is difficult or troublesome to connect the terminals to the connector. Alternatively, it may be necessary to perform the bending process again for some of the terminals in order to align the positions of the tip ends of the terminals.

The present disclosure provides a semiconductor device capable of suppressing such a situation.

In an embodiment of the present disclosure, a semiconductor device includes a semiconductor element, a sealing body that seals the semiconductor element therein, and a plurality of terminals that are electrically connected to the semiconductor element inside of the sealing body and project outside from the sealing body. Each of the plurality of terminals has a rough surface area in a section in a longitudinal direction of the terminal. The rough surface area has a larger surface roughness than a peripheral area.

In such a configuration, each of the plurality of terminals has the rough surface area having a large surface roughness in a section in the longitudinal direction of the terminal. The section having the rough surface area serves as a locally fragile part in each terminal. In a case where each terminal has such a fragile part, plastic deformation, which is generated in each terminal when a bending process is applied to the terminal, can be concentrated on the fragile part. That is, since a position in the longitudinal direction in which each terminal is plastically deformed can be intentionally limited, spring back that will occur thereafter can be suppressed or accurately predicted. As a result, it is less likely that the positions of the tip ends of the terminals will be deviated, when the bending process is applied to the terminals.

In an embodiment of the present disclosure, the position of the rough surface area in the longitudinal direction may be the same between the plurality of terminals. In such a configuration, each of the plurality of terminals can be deformed at the same position in the longitudinal direction. Therefore, uniform bending can be applied to the plurality of terminals.

In an embodiment of the present disclosure, a dimension of the rough surface area in the longitudinal direction may be smaller than a dimension of a base end of the terminal in a width direction. In such a configuration, it is possible to more accurately limit the position where the plastic deformation is generated in each of the terminals.

In an embodiment of the present disclosure, a distance between the rough surface area and the sealing body in the longitudinal direction may be smaller than a dimension of a base end of the terminal in a width direction. In such a case, the rough surface area may be in contact with the sealing body or may be separated from the sealing body. In such a configuration, since the rough surface area is located in the vicinity of the base end of the terminal, each terminal can be bent with high accuracy in the vicinity of the base end.

In an embodiment of the present disclosure, the rough surface area may extend from an inside to an outside of the sealing body. Namely, each of the plurality of terminals has the rough surface area also in the inside of the sealing body. In such a configuration, it is possible to improve an adhering property between the plurality of terminals and the sealing body, which is for example made of a resin, at the rough surface area in the inside of the sealing body.

In an embodiment of the present disclosure, the rough surface area may be provided in at least a part in the width direction of the terminal in the section. Namely, the position and the dimension of the rough surface area in the width direction may be modified in various ways. For example, the rough surface area may be contiguous to one end in the width direction of the terminal. As another example, the rough surface area may be contiguous to both ends in the width direction of the terminal. As further another example, the rough surface area may be separate from both ends in the width direction of the terminal. Moreover, the shape of the rough surface area is not particularly limited, and the rough surface area may have, for example, a triangular shape, a rectangular shape, a circular shape, or a wavy line shape.

In an embodiment of the present disclosure, each of the plurality of terminals may be provided with a metal plating film on its surface. In such a configuration, the plating amount and/or plating state of the metal plating film may be different between the rough surface area and the other area on the surface of the terminal. Therefore, when a deformation force is applied to each of the terminals, the terminal is likely to be plastically deformed in the rough surface area. As such, the effect of the present disclosure can be further enhanced. For example, the metal plating film may be made of a metal such as nickel.

In an embodiment of the present disclosure, the metal plating film may be oxidized in the rough surface area. As an example, the metal plating film may be oxidized by laser irradiation in the rough surface area. In such a case, at the boundary of the rough surface area, a step that is depressed from a peripheral area may be formed. When such a step is formed at the boundary of the rough surface area, each terminal is easily plastically deformed in the rough surface area.

In an embodiment of the present disclosure, the semiconductor element may have a plurality of signal electrodes. In such a case, the terminals may be signal terminals electrically connected to the signal electrodes. Therefore, when the signal terminals are connected to the connector on a circuit board, for example, each of the signal terminals can be deformed at a desired position in the longitudinal direction of the signal terminal according to the relative position of the connector with respect to the signal terminals. As a result, it is possible to restrict each signal terminal from being plastically deformed at an unintended position.

In an embodiment of the present disclosure, the semiconductor element may be a power semiconductor element. As an example, the semiconductor element may be an insulated gate bipolar transistor (IGBT), a metal oxide semiconductor field effect transistor (MOSFET), or another type of power semiconductor element.

Hereinafter, a semiconductor device 10 as an embodiment of the present disclosure will be described more in detail with reference to the drawings. The semiconductor device 10 may be adopted in, for example, a power control device for an electric vehicle, and can form a part of a power conversion circuit such as a converter or an inverter. The electric vehicle herein broadly means a vehicle having a motor for driving wheels, and for example, an electric vehicle charged by an external electric power, a hybrid vehicle having an engine in addition to the motor, a fuel cell vehicle having a fuel cell as the power source and the like.

As shown in FIGS. 1 to 4, the semiconductor device 10 has a plurality of semiconductor elements 20 and a sealing body 18. The sealing body 18 is made by using an insulating material. As an example, the sealing body 18 can be made using, for example, an epoxy resin. The sealing body 18 generally has a plate shape. The sealing body 18 has a first main surface 18a and a second main surface 18b located on the opposite side of the first main surface 18a. Further, the sealing body 18 has a first end surface 18c, a second end surface 18d, a first side surface 18e, and a second side surface 18f, which are located between the first main surface 18a and the second main surface 18b.

Each of the semiconductor elements 20 is a power semiconductor element. The semiconductor element 20 includes a semiconductor substrate 20a and a plurality of electrodes 20b, 20c, and 20d. The plurality of electrodes 20b, 20c, 20d include a first main electrode 20b and a second main electrode 20c that are connected to a power circuit, and a plurality of signal electrodes 20d connected to a signal circuit. Although not particularly limited, the semiconductor element 20 is a switching element, and can turn on and off electrical conduction between the first main electrode 20b and the second main electrode 20c. The first main electrode 20b and the plurality of signal electrodes 20d are located on a first surface of the semiconductor substrate 20a, and the second main electrode 20c is located on a second surface of the semiconductor substrate 20a.

Figure 4:
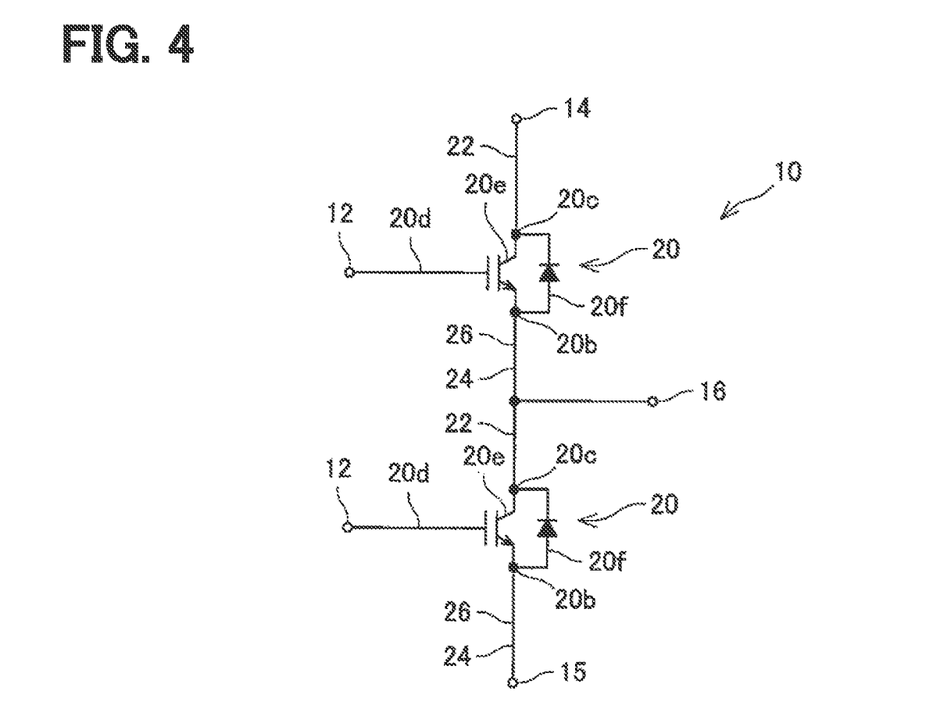
FIG. 4 is an electronic circuit diagram of the semiconductor device.

Mainly as shown in FIG. 4, the semiconductor element 20 of the present embodiment is a switching element and includes an IGBT structure 20e. The first main electrode 20b is connected to an emitter of the IGBT structure 20e, and the second main electrode 20c is connected to a collector of the IGBT structure 20e. Further, the signal electrode 20d is connected to a gate of the IGBT structure 20e. In addition, the semiconductor element 20 includes a diode structure 20f connected in parallel with the IGBT structure 20e. The first main electrode 20b is connected to an anode of the diode structure 20f, and the second main electrode 20c is connected to a cathode of the diode structure 20f. As another example, the semiconductor device 20 may include a MOSFET structure. In such a case, the first main electrode 20b is connected to a source of the MOSFET structure, the second main electrode 20c is connected to a drain of the MOSFET structure, and the signal electrode 20d is connected to a gate of the MOSFET structure.

In the present embodiment, the plurality of semiconductor elements 20 are semiconductor elements of the same type as each other. However, it is not always necessary that the plurality of semiconductor elements are the same type, and the plurality of semiconductor elements 20 may be semiconductor elements of different types from each other. The specific configuration of the semiconductor element 20 is not particularly limited, and various semiconductor elements can be adopted for the semiconductor element 20. The material of the semiconductor substrate 20a of the semiconductor element 20 is not particularly limited, and various semiconductor materials such as silicon (Si), silicon carbide (SiC), and gallium nitride (GaN) can be adopted.

The semiconductor device 10 further includes a plurality of first conductor plates 22 and a plurality of second conductor plates 24. Each of the first conductor plates 22 and second conductor plates 24 is made of a conductive material such as copper or other metal. The first conductor plate 22 and the second conductor plate 24 are held by the sealing body 18 and face each other with the corresponding semiconductor element 20 interposed therebetween. An upper surface 22a of the first conductor plate 22 is located inside the sealing body 18, and is bonded to the second main electrode 20c of the semiconductor element 20 via a solder layer 23. A lower surface 22b of the first conductor plate 22 is exposed from the second main surface 18b of the sealing body 18. As a result, the first conductor plate 22 constitutes a part of a circuit electrically connected to the semiconductor element 20, and also functions as a heat radiation plate that releases heat of the semiconductor element 20 to the outside.

A lower surface 24b of the second conductor plate 24 is located inside the sealing body 18, and is connected to the first main electrode 20b of the semiconductor element 20 via a conductor spacer 26. The lower surface 24b of the second conductor plate 24 is bonded to the conductor spacer 26 via a solder layer 27, and the conductor spacer 26 is bonded to the first main electrode 20b of the semiconductor element 20 via a solder layer 25. The upper surface 24a of the second conductor plate 24 is exposed from the first main surface 18a of the sealing body 18. Similar to the first conductor plate 22, the second conductor plate 24 constitutes a part of a circuit electrically connected to the semiconductor element 20, and also functions as a heat radiation plate that releases heat of the semiconductor element 20 to the outside.

Figure 1:
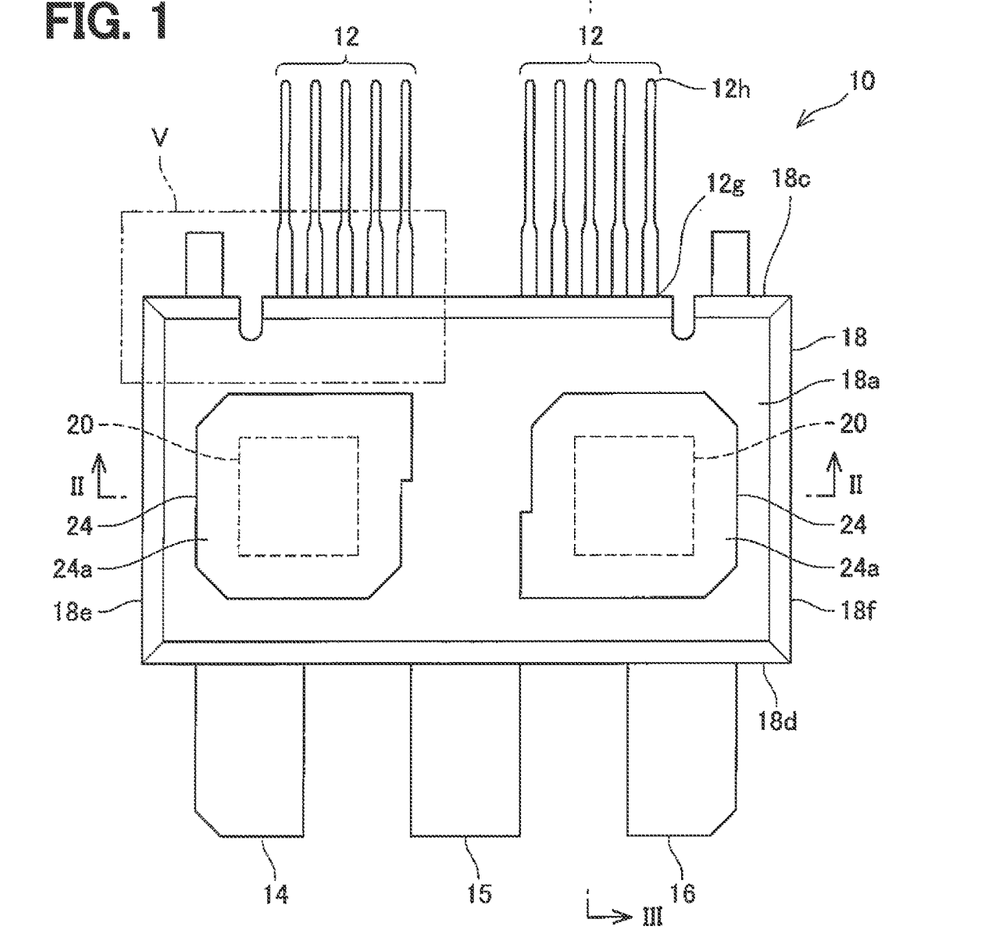
FIG. 1 is a plan view showing an external appearance of a semiconductor device according to an embodiment of the present disclosure.
Figure 2:
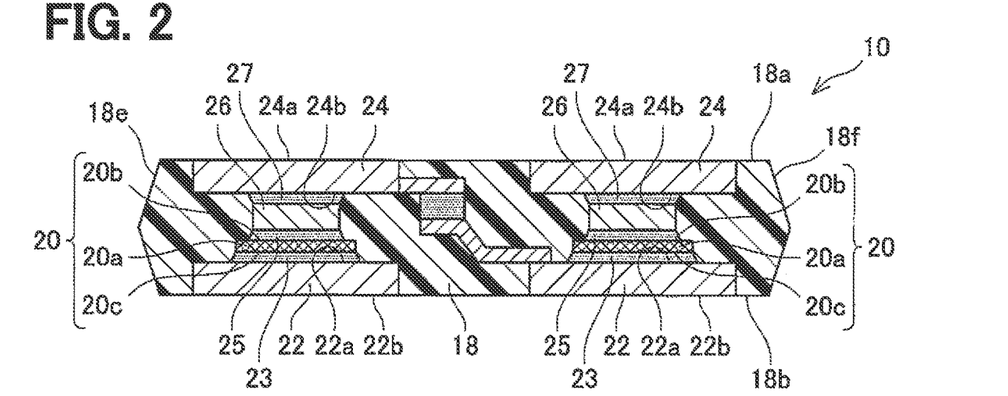
FIG. 2 is a cross-sectional view taken along a line II-II in FIG. 1.
Figure 3:
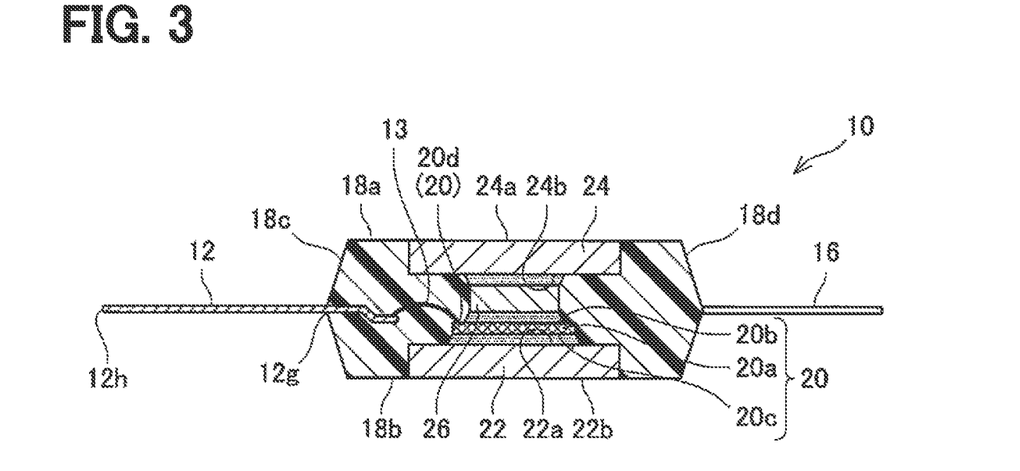
FIG. 3 is a cross-sectional view taken along a line III-Ill in FIG. 1.

The semiconductor device 10 includes a plurality of signal terminals 12 and a plurality of power terminals 14, 15, and 16. The plurality of power terminals 14, 15 and 16 include a first power terminal 14, a second power terminal 15, and a third power terminal 16. The first power terminal 14 and the second power terminal 15 are connected to, for example, an external DC power source (not shown), and the third power terminal 16 is connected to, for example, a load of a motor (not shown). Each of the power terminals 14, 15 and 16 projects from the second end surface 18d of the sealing body 18. The power terminals 14, 15 and 16 are electrically connected to each other via the semiconductor element 20 inside the sealing body 18. The plurality of signal terminals 12 project from the first end surface 18c of the sealing body 18. Each of the signal terminals 12 extends from a base end 12g, which is in contact with the first end surface 18c, to a tip end 12h. Each of the signal terminals 12 is electrically connected to the signal electrode 20d of the semiconductor element 20 via, for example, a bonding wire 13, as shown in FIG. 3. The plurality of signal terminals 12 and the plurality of power terminals 14, 15 and 16 are each made of a metal such as copper or other metal.

Figure 5:
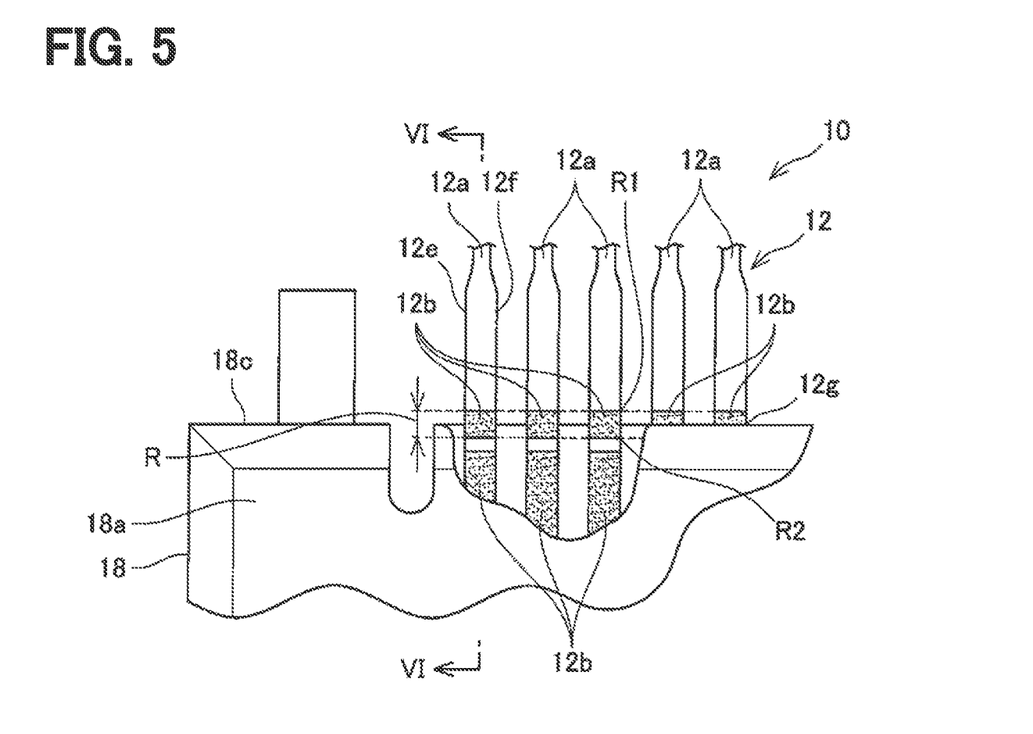
FIG. 5 is an enlarged view of a part V in FIG. 1.
Figure 6:
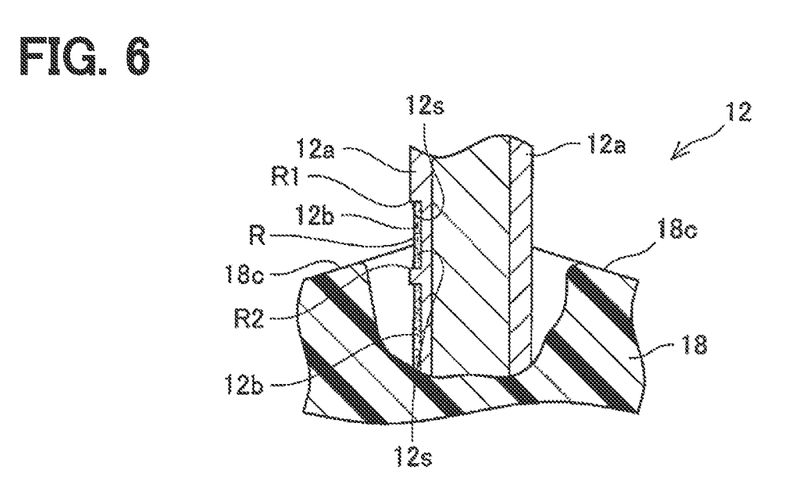
FIG. 6 is a cross-sectional view taken along a line VI-VI in FIG. 5.

Next, with reference to FIGS. 5 and 6, details of each of the plurality of signal terminals 12 of the present embodiment will be described. As shown in FIGS. 5 and 6, each of the plurality of signal terminals 12 has an elongated shape protruding from the sealing body 18. Each of the plurality of signal terminals 12 has a rough surface area R having a large surface roughness. The rough surface area R is provided in a section in the longitudinal direction of the signal terminal 12, and at least a part of the rough surface are R is located outside the sealing body 18. Further, the rough surface area R is formed, for example, from one side end 12e to the other side end 12f in the width direction of the signal terminal 12. As an example, the rough surface area R has a generally rectangular shape, and extends over the entire width of the signal terminal 12 in a section that begins from a lower end R2 adjacent to the sealing body 18 and ends at an upper end R1 away from the sealing body 18. The plurality of signal terminals 12 have the rough surface areas R at the same position in the longitudinal direction, that is, in a protruding direction.

Specifically, a metal plating film 12a is provided on a surface of each of the plurality of signal terminals 12. The metal plating film 12a is made of, for example, a nickel-based metal. The nickel-based metal refers to pure nickel or an alloy containing nickel as a main component. In addition, a metal oxide film 12b is provided on the metal plating film 12a in a part including the rough surface area R, in each of the plurality of signal terminals 12. The metal oxide film 12b is formed with fine irregularities, and thus the surface of the metal oxide film 12b has a larger surface roughness than the surface of the metal plating film 12a. The rough surface area R is defined by the surface roughness of the metal oxide film 12b. The metal oxide film 12b is, for example, an oxidized metal plating film 12a, and is made of an oxidized nickel-based metal. Here, the metal oxide film 12b may be formed so that the film thickness thereof is about 2.5 μm or less. Further, at the boundary of the rough surface area R, such as at the upper end R1 or the lower end R2 of the rough surface area R, a step 12s is formed. The step 12s is depressed with respect to a peripheral area, that is, the surface of the exposed metal plating film 12a. That is, the height of the surface of the signal terminal 12 in the rough surface area R is lower than the height of the signal terminal 12 in the area other than the rough surface area R. The height of the step 12s may be, for example, 2.5 μm or less.

In the semiconductor device 10 of the present embodiment, the metal oxide film 12b is formed by forming a metal plating film 12a on the surface of the signal terminal 12 and then selectively irradiating an area to be the rough surface area R with a pulsed laser. The formation of such a metal oxide film 12b can be performed, for example, by using the method disclosed in JP 2017-208385 A, which corresponds to US2019/0221490A1 and is incorporated herein by reference. In such a case, as an example, each recess portion of the fine irregularities on the metal oxide film 12b has a width of 5 μm to 300 μm, and a depth of 0.5 μm to 5 μm. Further, an average width of projection portions of the fine irregularities of the metal oxide film 12b is, for example, 1 nm to 300 nm, and an average spacing between the projection portions is, for example, 1 nm to 300 nm. An average film thickness of the metal oxide film 12b is 10 nm to several hundred nm.

In such a semiconductor device 10, when connecting the plurality of signal terminals 12 to a connector (not shown), the plurality of signal terminals 12 may be bent in advance according to the position and orientation of the connector. At this time, even if a bending process is uniformly applied to the plurality of signal terminals 12 using a tool or the like, a spring back occurs unevenly in each signal terminal 12. As a result, the positions of the tip ends 12h of the plurality of signal terminals 12 are likely to be deviated. If the positions of the tip ends 12h of the plurality of signal terminals 12 are not aligned, it becomes difficult or troublesome to connect the plurality of signal terminals 12 to the connector. Alternatively, in order to align the positions of the tip ends 12h of the plurality of signal terminals 12, some signal terminals 12 need to be bent again.

In order to solve such an issue, in the semiconductor device 10 of the present embodiment, each of the plurality of signal terminals 12 has the rough surface area R having a large surface roughness in a section in the longitudinal direction of the signal terminal 12. The section provided with the rough surface area R serves as a locally fragile portion in each signal terminal 12. In a case where each signal terminal 12 has such a fragile portion, the plastic deformation, which occurs in each signal terminal 12 when the bending process is applied to the plurality of signal terminals 12, can be concentrated on the fragile portion. That is, since the position in the longitudinal direction in which each signal terminal 12 is plastically deformed can be intentionally limited, the spring back that occurs thereafter can be suppressed or accurately predicted. As a result, when the plurality of signal terminals 12 are bent, for example, it is less likely that the positions of the tip ends 12h of the plurality of signal terminals 12 will be uneven.

In the present embodiment, the semiconductor element 20 has the plurality of signal electrodes 20d. The signal electrodes 20d are electrically connected to the signal terminals 12. Therefore, when the signal electrodes 20d are connected to a connector on a circuit board, for example, the signal terminals 12 can be deformed at a desired position in the longitudinal direction of the signal terminals 12 according to the relative position of the connector with respect to the signal terminals 12. As a result, it is possible to restrict each signal terminal 12 from being plastically deformed at an unintended position.

Further, in the semiconductor device of the present embodiment, the position of the rough surface area R in the longitudinal direction is equal to each other among the plurality of signal terminals 12. According to such a configuration, each of the plurality of signal terminals 12 can be deformed at the same position in the longitudinal direction. Therefore, the bending process can be uniformly applied to the plurality of signal terminals 12.

In the semiconductor device 10 of the present embodiment, the dimension of the rough surface area R in the longitudinal direction is smaller than the width dimension at the base end 12g of the signal terminal 12. According to such a configuration, the position where the plastic deformation is generated can be more accurately limited in each signal terminal 12.

In the semiconductor device 10 of the present embodiment, the upper end R1 of the rough surface area R is located outside the sealing body 18, and the lower end R2 of the rough surface area R is located inside the sealing body 18. In the semiconductor device 10 of the present embodiment, in consideration of the processing accuracy of the rough surface area R, it is designed that the distance from the upper end R1 of the rough surface area R to the surface of the sealed body 18 is 0.4 mm or more, and the distance from the lower end R2 to the sealing body 18 is between 0 and 0.15 mm. However, the position of the rough surface area R is not limited to the positions illustrated in FIGS. 5 and 6, and at least the upper end R1 may be located outside the sealing body 18.

Note that the position where the rough surface area R is formed, the dimensions of the rough surface area R such as the length, the width, and the thickness, or the shape of the rough surface area R can be changed or adjusted in various ways depending on the manufacturing tolerance or design specifications of the semiconductor device 10. Variously modified examples of the rough surface area R of the signal terminal 12 will be described with reference to FIGS. 7A to 7C, FIGS. 8A to 8C, and FIGS. 9A to 9C.

Figure 7A:
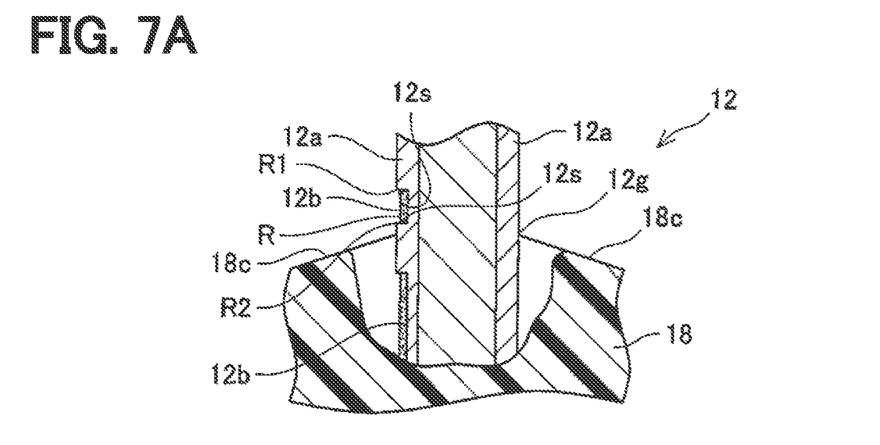
FIG. 7A is a cross-sectional view showing a modified example of a rough surface area of a terminal.
Figure 7B:
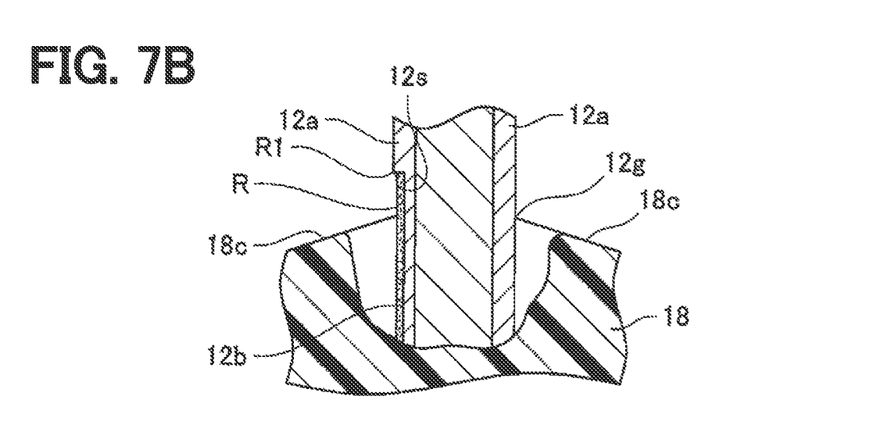
FIG. 7B is a cross-sectional view showing a modified example of a rough surface area of a terminal.
Figure 7C:
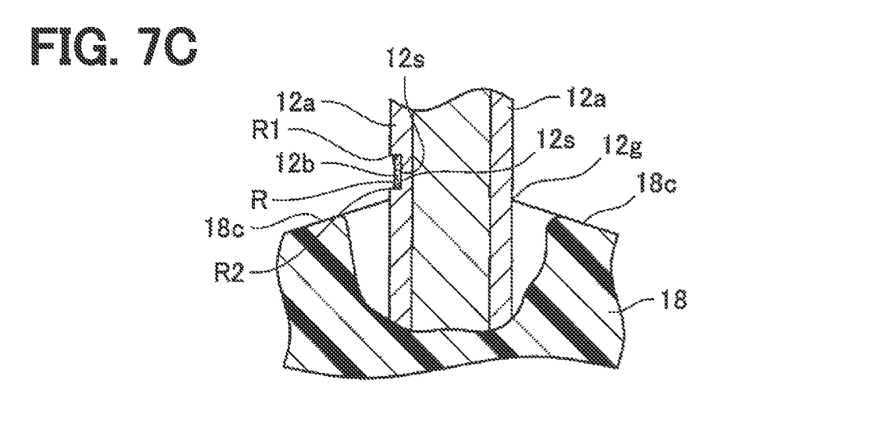
FIG. 7C is a cross-sectional view showing a modified example of a rough surface area of a terminal.

As a modification of the rough surface area R, the distance from the rough surface area R to the sealing body 18 may be smaller than the width dimension of the base end 12g of the signal terminal 12. In such a configuration, as shown in FIGS. 7A and 7C, the upper end R1 and the lower end R2 of the rough surface area R may be located outside the sealing body 18. That is, the rough surface area R may be away from the sealing body 18. Alternatively, the rough surface area R may be in contact with the sealing body 18. In such configurations, since the rough surface area R is located in the vicinity of the base end 12g of the signal terminal 12, the signal terminal 12 can be accurately bent in the vicinity of the base end 12g.

As a modification, the rough surface area R may extend from the inside of the sealing body 18 to the outside. As shown in FIG. 6 and FIG. 7A, the rough surface area R may be extended intermittently. Alternatively, as shown in FIG. 7B, the rough surface area R may be continuously extended. In such a case, each of the plurality of signal terminals 12 has the rough surface area R also in the inside of the sealing body 18. According to such a configuration, the adhering property between the rough surface areas R of the plurality of signal terminals 12 and the sealing body 18 (for example, resin) can be improved inside the sealing body 18. Alternatively, as shown in FIG. 7C, each of the plurality of signal terminals 12 may not have the rough surface area R inside the sealing body 18.

Figure 8A:
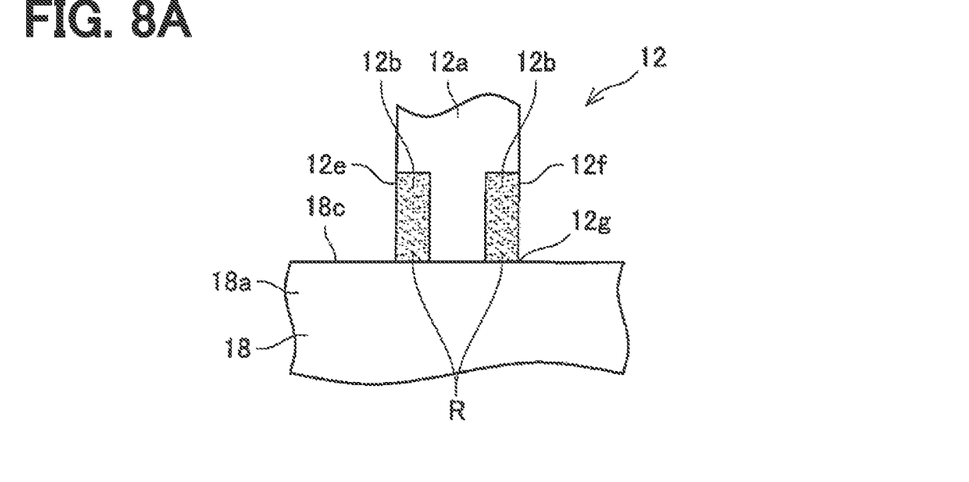
FIG. 8A is a plan view showing a modified example of a rough surface area of a terminal.
Figure 8B:
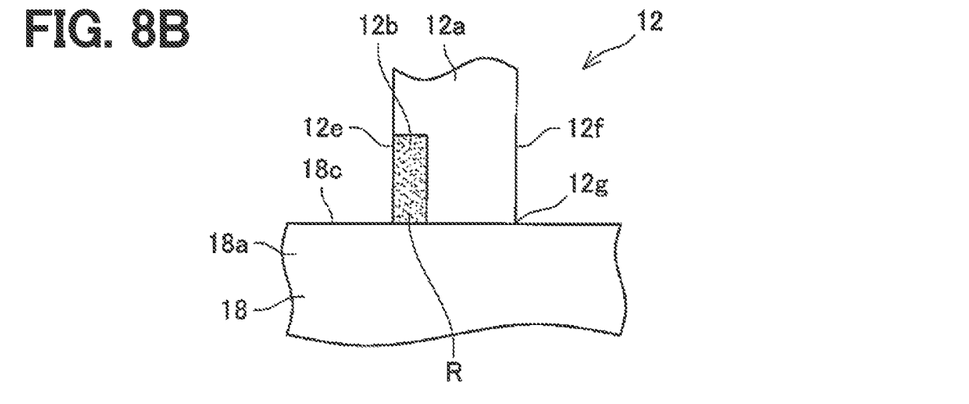
FIG. 8B is a cross-sectional view showing a modified example of a rough surface area of a terminal.
Figure 8C:
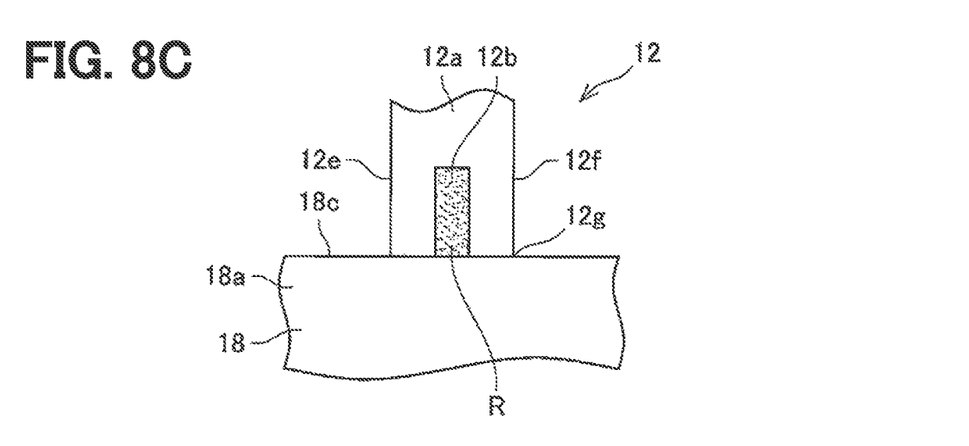
FIG. 8C is a cross-sectional view showing a modified example of a rough surface area of a terminal.

In the semiconductor device 10 of the present embodiment, the rough surface area R is formed from one side end 12e to the other side end 12f in the width direction of the signal terminal 12. However, the position where the rough surface area R is formed in the width direction of the signal terminal 12 is not particularly limited. As shown in FIG. 8A, the rough surface area R may be divided into a first part that is contiguous to one side end 12e of the signal terminal 12 and a second part that is contiguous to the other side end 12f of the signal terminal 12 in the width direction of the signal terminal 12. Alternatively, as shown in FIG. 8B, the rough surface area R may be contiguous to only the one side end 12e or the other side end 12f of the signal terminal 12. As further another example, as shown in FIG. 8C, the rough surface area R may be formed to be separated from both the one side end 12e and the other side end 12f.

Figure 9A:
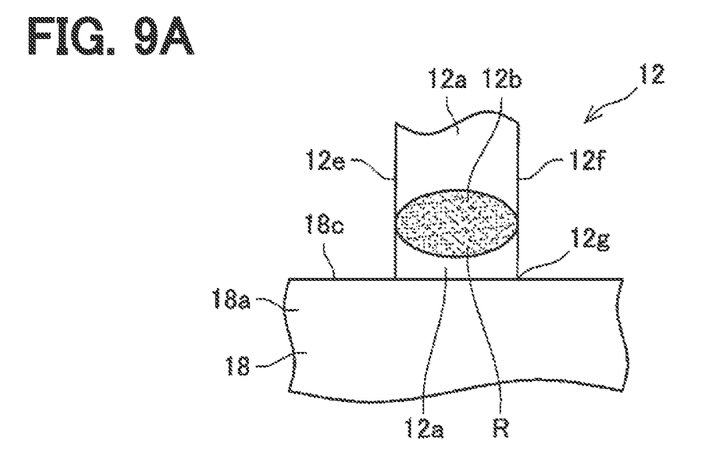
FIG. 9A is a plan view showing a modified example of a rough surface area of a terminal.
Figure 9B:
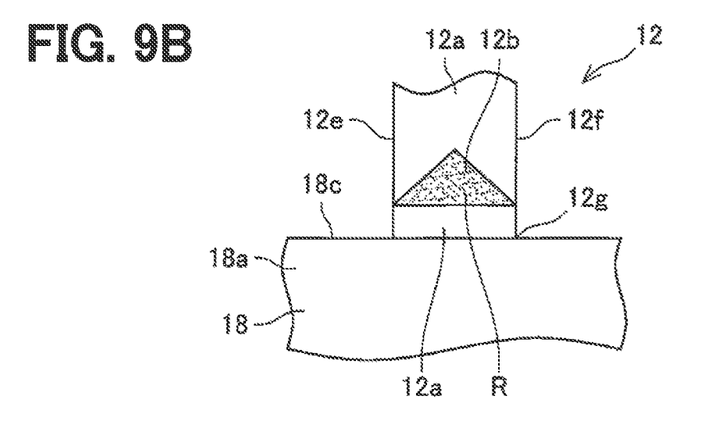
FIG. 9B is a cross-sectional view showing a modified example of a rough surface area of a terminal.
Figure 9C:
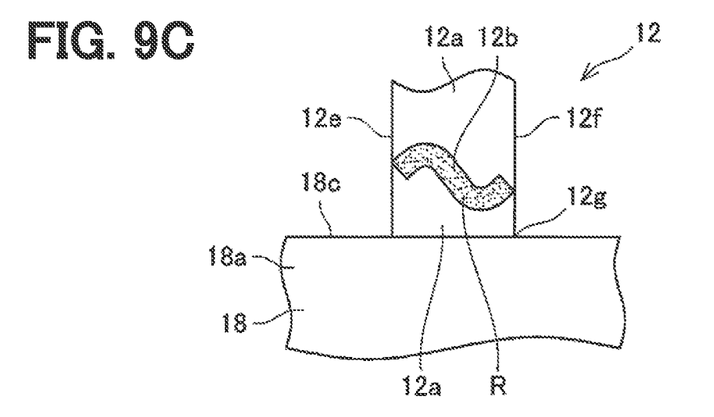
FIG. 9C is a cross-sectional view showing a modified example of a rough surface area of a terminal.

In the semiconductor device 10 of the present embodiment, the rough surface area R has a rectangular shape. However, the shape of the rough surface area R is not limited to the rectangular shape. The rough surface area R may have an elliptical shape or a circular shape as shown in FIG. 9A. As another example, the rough surface area R may have a triangular shape or a polygonal shape as shown in FIG. 9B. As further another example, the rough surface area R may have a linear shape, or a wavy line shape as shown in FIG. 9C.

As described above, the rough surface area R can be changed in various ways, and each of the plurality of signal terminals 12 at least has the rough surface area R having a large surface roughness in a section in the longitudinal direction of the signal terminal 12.

In the semiconductor device 10 of the present embodiment, each of the signal terminals 12 is formed with the metal plating film 12a on its surface. According to such a configuration, the amount of plating film and/or the state of the plating film are different between the rough surface area R and the other area, such as a peripheral area on the surface of the signal terminal 12. Therefore, when a deforming force acts on the signal terminals 12, each signal terminal 12 is likely to be plastically deformed in the rough surface area R. In particular, in the present embodiment, the rough surface area R is oxidized by irradiating the metal plating film 12a with a laser beam, and thus the metal plating film 12a is fragile in the rough surface area R. Therefore, when the deforming force acts on the signal terminal 12, cracks are likely to occur in the metal plating film 12a in the rough surface area R, and plastic deformation is likely to occur in the signal terminal 12 starting from the cracked position. As a result, the effect of intentionally limiting the position of the plastic deformation in the longitudinal direction of the signal terminal 12 can be further enhanced.

Further, at the boundary of the rough surface area R in the semiconductor device 10, the step 12s defining the recessed portion with respect to the peripheral area is formed. When such a step 12s is formed at the boundary of the rough surface area R, each signal terminal 12 is more likely to be plastically deformed in the rough surface area R. In the present embodiment, in the rough surface area R, the metal plating film 12a is oxidized by, for example, laser irradiation. However, the method for forming the rough surface area R is not limited to a roughening method by the laser irradiation, and the rough surface area R may be formed by another roughening technique.

In the semiconductor device 10 of the present embodiment, the rough surface area R is formed only on the surface of each of the plurality of signal terminals 12. As another embodiment, the rough surface area R may be provided on the surface of each of the plurality of power terminals 14, 15, and 16.

The semiconductor device 10 of the present embodiment has the two semiconductor elements 20. However, the number of the semiconductor elements 20 included in the semiconductor device 10 is not limited to two, and may be one or three or more. Depending on the number of semiconductor elements 20, the number of the conductor plates 22, 24, the number of the conductor spacers 26, the number of the power terminals 14, 15 and the number of the signal terminals 12 may be changed.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
a semiconductor element;
a sealing body that seals the semiconductor element therein; and
a plurality of terminals that are electrically connected to the semiconductor element inside the sealing body, and project from the sealing body,
wherein
each of the plurality of terminals has a rough surface area in a section in a longitudinal direction on a surface of the terminal and a peripheral area on a periphery of the rough surface area in the longitudinal direction on the surface, the surface being parallel to a main surface of the sealing body, the rough surface area having a larger surface roughness than the peripheral area,
a distance between the rough surface area and the sealing body is smaller than a dimension of a base end of the terminal in a width direction of the terminal,
the rough surface area is in contact with the sealing body,
the rough surface area extends from an inside of the sealing body to an outside of the sealing body, and
the terminal has a step portion depressed from the peripheral area at a boundary of the rough surface area on the surface of the terminal.

2. The semiconductor device according to claim 1, wherein
in the section of the terminal, the rough surface area is disposed at least at a part in the width direction on the surface of the terminal.

3. The semiconductor device according to claim 2, wherein
the rough surface area is disposed to be contiguous to a side end of the terminal in the width direction on the surface of the terminal.

4. The semiconductor device according to claim 2, wherein
the rough surface area is disposed to be contiguous to both side ends of the terminal in the width direction on the surface of the terminal.

5. The semiconductor device according to claim 2, wherein
the rough surface area includes a first part contiguous to a side end of the terminal and a second part contiguous to an opposite side end of the terminal in the width direction on the surface of the terminal, and
the first part and the second part are separate from each other in the width direction of the terminal.

6. The semiconductor device according to claim 2, wherein
the rough surface area is disposed separate from both side ends of the terminal in the width direction on the surface of the terminal.

7. The semiconductor device according to claim 1, wherein
the plurality of terminals have the rough surface areas at a same position in the longitudinal direction.

8. The semiconductor device according to claim 1, wherein
a dimension of the rough surface area in the longitudinal direction is smaller than the dimension of the base end of the terminal in the width direction of the terminal.

9. The semiconductor device according to claim 8, wherein
each of the plurality of terminals has a metal plating film on the surface thereof.

10. The semiconductor device according to claim 9, wherein
the rough surface area is provided by an oxidized portion of the metal plating film.

11. The semiconductor device according to claim 1, wherein
the rough surface area has one of a triangular shape, a rectangular shape, a circular shape, and a wavy line shape.

12. The semiconductor device according to claim 1, wherein
the semiconductor element includes a plurality of signal terminals electrically connected to signal electrodes of the semiconductor element, and
the plurality of terminals are the plurality of signal terminals.

13. The semiconductor device according to claim 1, wherein
the semiconductor element is a power semiconductor element.

14. A semiconductor device comprising:
a semiconductor element;
a sealing body that seals the semiconductor element therein; and
a plurality of terminals that are electrically connected to the semiconductor element inside the sealing body, and project from the sealing body, wherein
each of the plurality of terminals has a rough surface area in a section in a longitudinal direction on a surface of the terminal and a peripheral area on a periphery of the rough surface area in the longitudinal direction on the surface, the surface being parallel to a main surface of the sealing body, the rough surface area having a larger surface roughness than the peripheral area, and
the terminal has a step portion depressed from the peripheral area at a boundary of the rough surface area on the surface.

* * * * *